US007977679B2

(12) United States Patent  
Cho

(10) Patent No.: US 7,977,679 B2  
(45) Date of Patent: Jul. 12, 2011

(54) THIN FILM TRANSISTOR ARRAY PANEL

(75) Inventor: Yong-Seok Cho, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 104 days.

(21) Appl. No.: 11/755,215

(22) Filed: May 30, 2007

(65) Prior Publication Data

US 2008/0169473 A1 Jul. 17, 2008

(30) Foreign Application Priority Data

Jan. 16, 2007 (KR) .................... 10-2007-0004634

(51) Int. Cl.
H01L 29/04 (2006.01)
H01L 29/10 (2006.01)
(52) U.S. Cl. .......................................... 257/72; 257/59
(58) Field of Classification Search .............. 257/59, 257/72, E27.131; 438/30
See application file for complete search history.

(56) References Cited

U.S. PATENT DOCUMENTS

| 5,453,857 | A | 9/1995 | Takahara |
| 6,518,630 | B2 * | 2/2003 | You et al. ............. 257/380 |
| 7,084,943 | B2 | 8/2006 | Kubo et al. |
| 2002/0142505 | A1 | 10/2002 | Hwang et al. |
| 2004/0051103 | A1 * | 3/2004 | Hong et al. ............. 257/72 |
| 2004/0080690 | A1 | 4/2004 | Ko et al. |
| 2006/0157836 | A1 * | 7/2006 | Park et al. ............. 257/678 |
| 2006/0160260 | A1 * | 7/2006 | Cho et al. ............. 438/30 |

FOREIGN PATENT DOCUMENTS

| CN | 1825571 | 8/2006 |
| JP | 06-222372 | 8/1994 |
| JP | 10-031228 | 2/1998 |
| JP | 11-067882 | 3/1999 |
| JP | 2001-117083 | 4/2001 |
| JP | 2003-021844 | 1/2003 |
| JP | 2003-043513 | 2/2003 |
| KR | 1020050036343 | 4/2005 |
| KR | 1020050073661 | 7/2005 |
| KR | 1020060001028 | 1/2006 |
| KR | 1020060078136 | 7/2006 |

* cited by examiner

Primary Examiner — Hung Vu  
(74) Attorney, Agent, or Firm — F. Chau & Associates, LLC

(57) ABSTRACT

A thin film transistor array panel includes an insulating substrate, a plurality of gate lines formed on the substrate, a plurality of data lines, and an insulating layer. Each of the gate lines include a plurality of gate electrodes. The data lines cross the gate lines with insulation therebetween. Each of the data lines include a plurality of source electrodes. A plurality of drain electrodes face the source electrodes. The insulating layer is formed on the gate lines, the data lines, and the drain electrodes. A plurality of pixel electrodes are formed on the insulating layer and connected to the drain electrodes. The insulating layer has an opening or a trench and the opening or the trench is disposed in a part of the insulating layer that is not covered by the pixel electrodes.

18 Claims, 17 Drawing Sheets

THIN FILM TRANSISTOR ARRAY PANEL

CROSS-REFERENCE TO RELATED APPLICATION

This application claims priority to Korean Patent Application No. 10-2007-0004634, filed on Jan. 16, 2007, the disclosure of which is incorporated by reference in its entirety herein.

BACKGROUND OF THE INVENTION (a) Technical Field

The present disclosure relates to a thin film transistor array panel, and more particularly to a thin film transistor array panel for a liquid crystal display ("LCD").

(b) Discussion of the Related Art

LCDs are one of the most widely used flat panel displays. An LCD includes two panels provided with field-generating electrodes and a liquid crystal ("LC") layer disposed between the two panels. The field-generating electrodes may include a plurality of pixel electrodes and a common electrode. Voltages are applied to the field-generating electrodes to generate an electric field in the LC layer. The electric field determines the orientation of LC molecules in the LC layer to adjust polarization of incident light in the LC layer. The incident light having adjusted polarization is either intercepted or allowed to pass by a polarizing film, thereby displaying images.

LCDs can be classified as being transmissive or reflective depending on the light source used by the LCD. The light source of a transmissive LCD is a backlight. The light source of a reflective LCD is external light. A reflective type LCD may be implemented in small or medium sized display devices.

A transflective LCD uses both a backlight and external light as a light source depending on the circumstances, and may also be implemented in small or medium sized display devices.

However, the LC molecules may be arranged in a disorderly manner around the edges of a display region in an LCD, thereby causing disclination in a displayed image. The disclination may be improved by increasing the width of a light blocking layer in the LCD, but this may also reduce the aperture ratio of the pixels in the LCD. Thus, there exists a need for a LCD that reduces disclination without decreasing the aperture ratio of the pixels in the LCD.

BRIEF SUMMARY OF THE INVENTION

In an exemplary embodiment of the present invention, a thin film transistor array panel is provided. The thin film transistor array panel includes an insulating substrate, a plurality of gate lines formed on the substrate, a plurality of data lines, and an insulating layer. Each of the gate lines include a plurality of gate electrodes. The data lines cross the gate lines with insulation therebetween. Each of the data lines include a plurality of source electrodes. A plurality of drain electrodes face the source electrodes. The insulating is layer formed on the gate lines, the data lines, and the drain electrodes. A plurality of pixel electrodes are formed on the insulating layer and connect to the drain electrodes. The insulating layer has openings or trenches disposed in the insulating layer at places that are not covered by the pixel electrodes.

The insulating layer may be made of an organic insulating material. The thin film transistor array panel may further include a light blocking layer disposed between adjacent pixel electrodes and overlapping the opening or the trench. The light blocking layer may be made of a same layer as the gate lines without overlapping from the gate lines. The light blocking layer may overlap the data lines. The thin film transistor array panel may further include a passivation layer formed under the insulating layer and covering the gate lines, the data lines, and the drain electrodes. The passivation layer and the insulating layer may have a plurality of contact holes to connect the pixel electrodes to the drain electrodes. The pixel electrodes may include a transparent electrode made of a transparent conductive material and a reflective electrode made of a reflective material. The insulating layer may have an embossed surface. Each of the pixel electrodes may include a first region occupied by the transparent electrode and a second region occupied by the transparent electrode and the reflective electrode.

According to an exemplary embodiment of the present invention, a method for manufacturing a TFT array panel is provided. The method includes the steps of forming a first conductive layer on an insulating substrate and patterning gate lines from the conductive layer, forming a gate insulating layer on the first conductive layer, forming an intrinsic layer on the gate insulating layer, forming an extrinsic layer on the intrinsic layer, forming a second conductive layer on the extrinsic layer and patterning data lines from the second conductive layer, forming an insulating layer on the second conductive layer, forming pixel electrodes on the insulating layer, and forming a trench by removing a portion of the insulating layer that is not covered by the pixel electrodes.

The method may include a step of forming a passivation layer on the insulating layer before forming the pixel electrodes, a step of forming a light blocking layer between adjacent pixel electrodes and overlapping the trench, a step of patterning gate electrodes and storage electrodes from the first conductive layer, a step of patterning extrinsic semiconductor stripes from the extrinsic layer and intrinsic semiconductor stripes from the intrinsic layer, a step of patterning source electrodes and drain electrodes from the second conductive layer, or a step of embossing a pattern on the insulating layer.

DETAILED DESCRIPTION OF EXEMPLARY EMBODIMENTS

Figure 1:
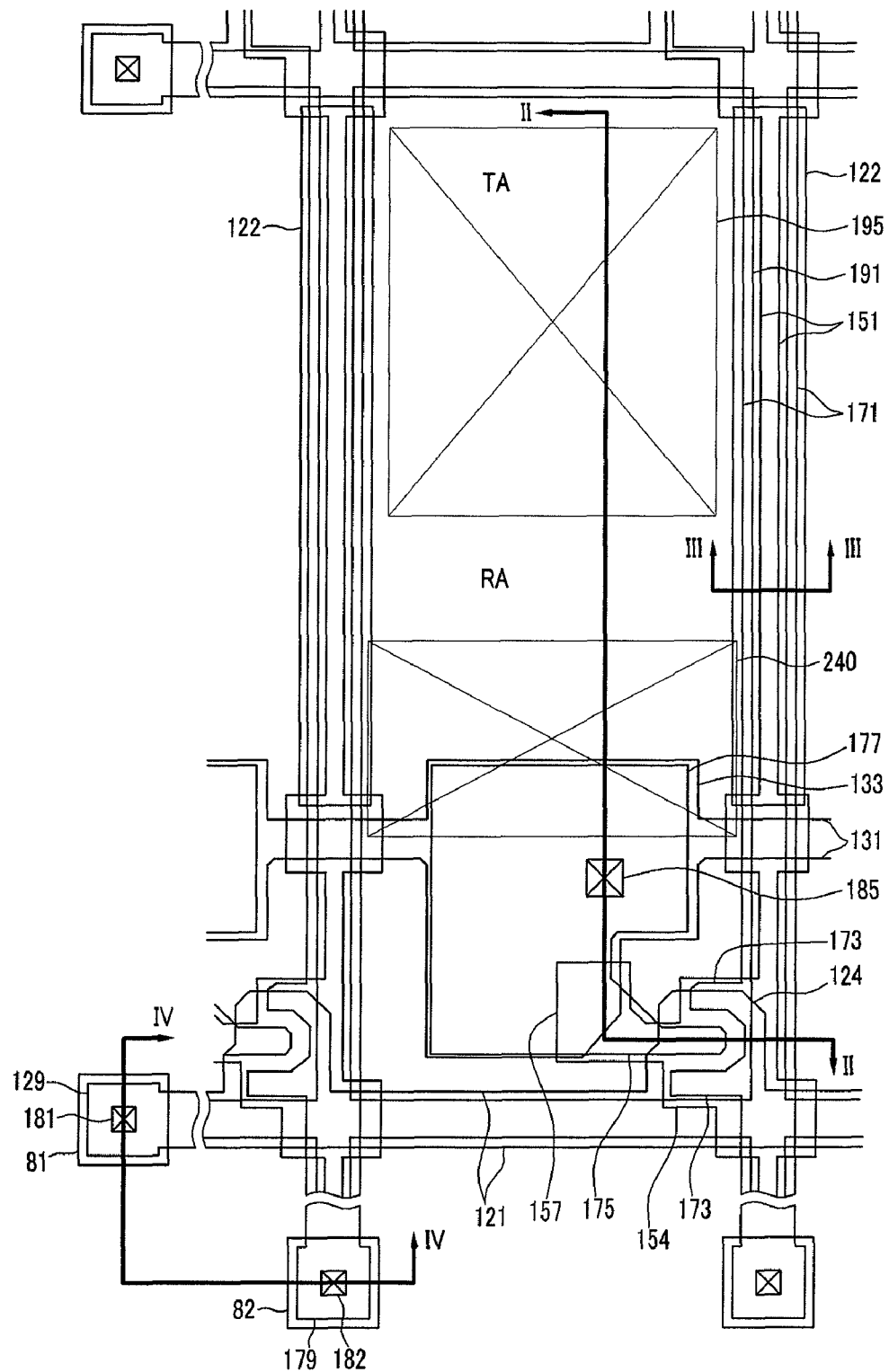
FIG. 1 is a layout view of an LCD according to an exemplary embodiment of the present invention.

Hereinafter, exemplary embodiments of the present invention will be described in detail with reference to the accompanying drawings. This invention may, however, be embodied in different forms and should not be construed as limited to the embodiments set forth herein.

In the drawings, the thickness of layers and regions may be exaggerated for clarity. Like numerals may refer to like elements throughout. It will be understood that when an element such as a layer, film, region, substrate or panel is referred to as being "on" another element, it can be directly on the other element or intervening elements may also be present.

Figure 2:
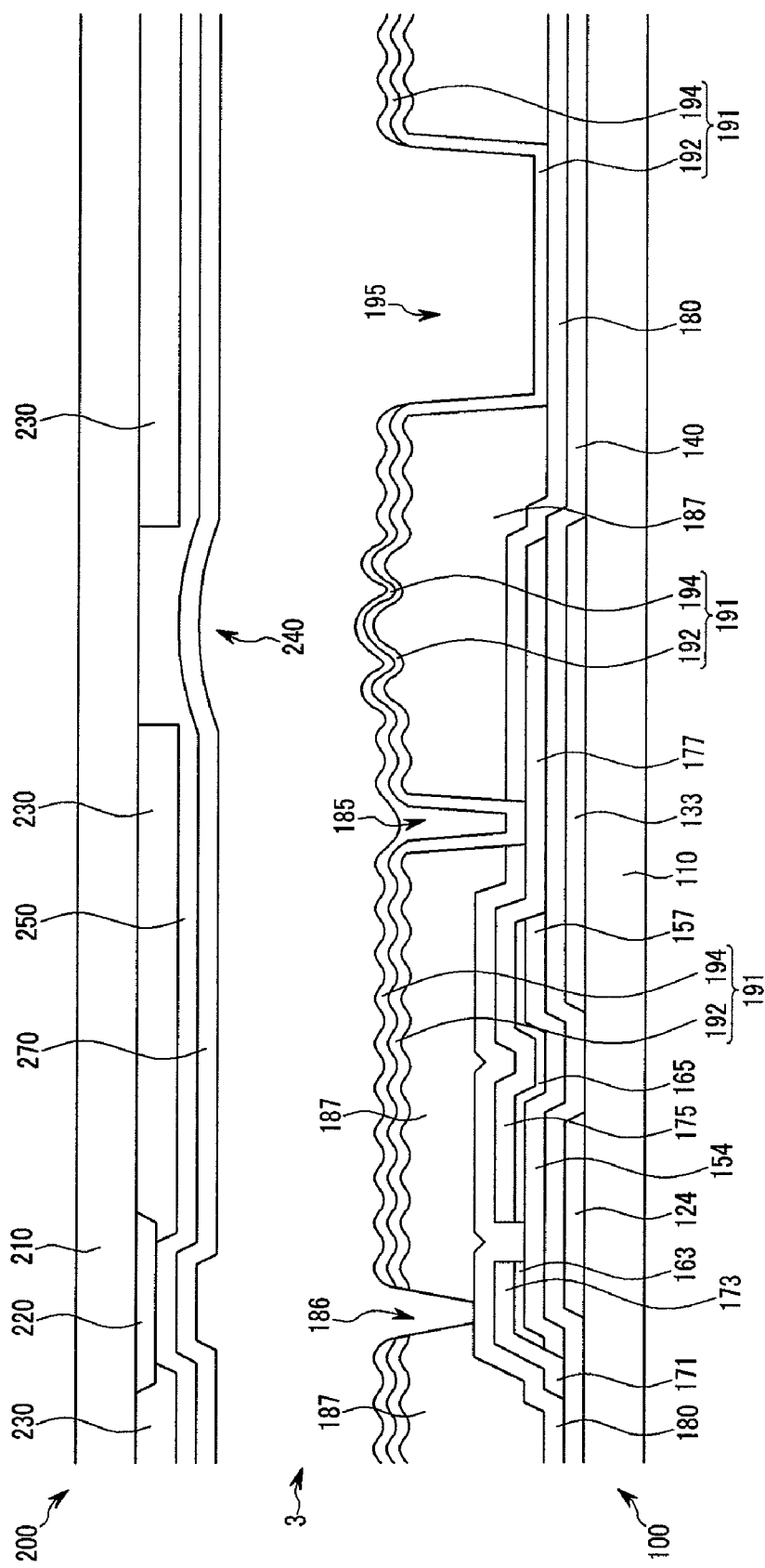
FIGS. 2, 3, and 4 are sectional views of the LCD shown in FIG. 1 taken along lines II-II, III-III and IV-IV.
Figure 3:
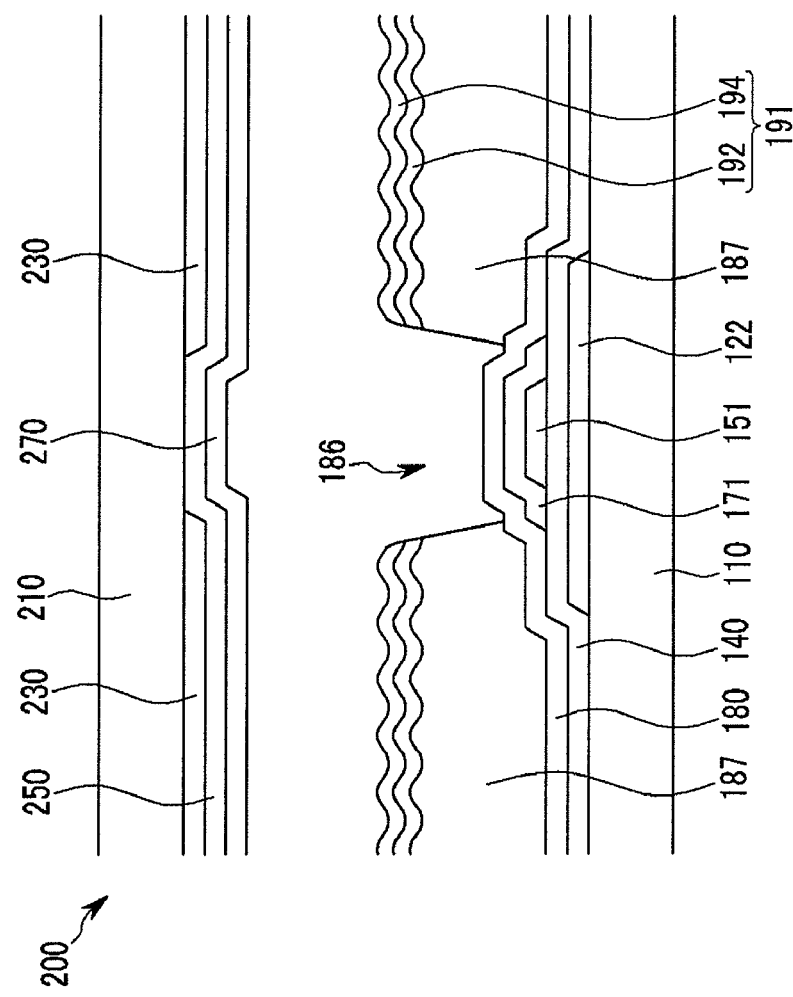
Figure 4:
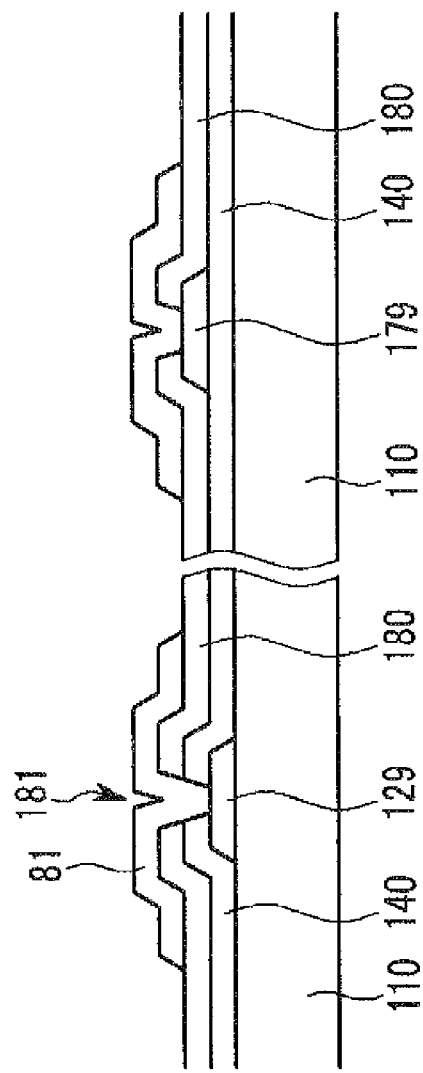

FIG. 1 is a layout view of an LCD according to an exemplary embodiment of the present invention, and FIGS. 2, 3, and 4 are sectional views of the LCD shown in FIG. 1 taken along lines II-II, III-III, and IV-IV.

The LCD includes a thin film transistor ("TFT") array panel 100, a common electrode panel 200 facing the TFT array panel 100, and a liquid crystal layer 3 interposed between the two panels 100 and 200. The LC layer 3 may have positive dielectric anisotropy. The two panels 100 and 200 may further include upper and lower alignment layers (not shown) that are aligned in horizontal and anti-parallel directions to each other, such that the LC layer 3 is subjected to horizontal and anti-parallel alignment and the LC molecules in the LC layer 3 are aligned with their long axes substantially horizontal with respect to the surfaces of the panels 100 and 200 in the absence of an electric field.

The LCD may be an electrically controlled birefringence (ECB) mode display and may be driven in a normally white mode in which the LCD displays a white color and has maximum transmittance in the absence of an electric field.

A plurality of gate lines 121, a plurality of storage electrode lines 131, and a plurality of light blocking layers 122 are formed on an insulating substrate 110 and made of a material such as, for example, transparent glass or plastic.

The gate lines 121 transmit gate signals and extend substantially in a transverse direction with reference to FIG. 1. Each of the gate lines 121 includes a plurality of gate electrodes 124 projecting upward therefrom and an end portion 129 having an area for contacting with another layer or an external driving circuit. A gate driving circuit (not shown) for generating the gate signals may be mounted on a flexible printed circuit ("FPC") film (not shown), which may be attached to the substrate 110, directly mounted on the substrate 110 or integrated with the substrate 110. The gate lines 121 may be extended to connect to a driving circuit that may be integrated with the substrate 110.

The storage electrode lines 131 are supplied with a predetermined voltage such as a common voltage applied to a common electrode 270 of the common electrode panel 200, and extend substantially parallel to the gate lines 121. Each of the storage electrode lines 131 is disposed between two adjacent gate lines 121 and disposed closer to the lower of the two gate lines 121. Each of the storage electrode lines 131 includes a storage electrode 133 projecting upward and downward therefrom as illustrated in FIG. 1. However, the storage electrode lines 131 may have various shapes and arrangements.

The light blocking layers 122 extend substantially in a vertical direction with reference to FIG. 1, without overlapping the gate lines 121 and the storage electrode lines 131. The light blocking lasers 122 are parallel to each other and each of the light blocking layers 122 are disposed between adjacent gate lines 121 and storage electrode lines 131.

The gate lines 121, the storage electrode lines 131, and the light blocking layers 122 may be are made of Al, Ag, Cu, Mo, Cr, Ta, Ti, or alloys thereof. The gate lines 121, the storage electrode lines 131, and the light blocking layers 122 may have a multi-layered structure including two conductive films (not shown) having different physical characteristics. In an exemplary embodiment of the present invention, one of the two conductive films is preferably made of a low resistive metal including, for example, Al, Ag, Cu, or alloys thereof for reducing signal delay or voltage drop. The other conductive film may be made of a material such as, for example, Mo, Cr, Ta, Ti, or alloys thereof which have good physical, chemical, and electrical contact characteristics with other materials such as, for example, indium tin oxide (ITO) or indium zinc oxide (IZO). An example of the combination of the two conductive films includes a lower Cr film and an upper Al—Nd (alloy) film.

The lateral sides of the gate lines 121, the storage electrode lines 131 and the light blocking layers 122 are inclined relative to a surface of the substrate 110, and the inclination angles thereof are in a range from about 20 degrees to about 80 degrees. A gate insulating layer 140, which may be made of, for example, silicon nitride (SiNx) or silicon oxide (SiOx), is formed on the gate lines 121 and the storage electrode lines 131.

A plurality of semiconductor stripes 151, which may be made of, for example, hydrogenated amorphous silicon (abbreviated to "a-Si") or polysilicon, are formed on the gate insulating layer 140. Each of the semiconductor stripes 151 extends substantially in the longitudinal direction (see FIG. 1) and includes a plurality of projections 154 that project toward the gate electrodes 124 and a plurality of projections 157 that project toward the storage electrode 133 from the respective projections 154. The semiconductor stripes 151 widen near the gate lines 121 and the storage electrode lines 131 such that the semiconductor stripes 151 cover larger areas of the gate lines 121 and the storage electrode lines 131.

A plurality of ohmic contact stripes and islands 161 and 165 are formed on the semiconductor stripes 151. The ohmic contact stripes and islands 161 and 165 may be made of, for example, n+ hydrogenated a-Si heavily doped with an n-type impurity such as phosphorous, or silicide. Each ohmic contact stripe 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof may range between about 30 degrees to about 80 degrees.

A plurality of data lines 171 and a plurality of drain electrodes 175 are formed on the ohmic contacts 161 and 165 and on the gate insulating layer 140.

The data lines 171 transmit data signals and extend substantially in the longitudinal direction to intersect the gate lines 121 and the storage electrode lines 131 as illustrated in FIG. 1. Each data line 171 includes a plurality of source electrodes 173 projecting toward the gate electrodes 124, and an end portion 179 having an area for contacting with another layer or an external driving circuit. A portion of each data line 171 between the gate lines 121 and the storage electrode lines 131 overlaps the light blocking layers 122. A data driving circuit (not shown) for generating the data signals may be mounted on an FPC film (not shown), which may be attached to the substrate 110, directly mounted on the substrate 110, or integrated with the substrate 110. The data lines 171 may be extended to connect to a driving circuit that may be integrated with the substrate 110.

The drain electrodes 175 are separated from the data lines 171 and disposed opposite the source electrodes 173 with respect to the gate electrodes 124. Each of the drain electrodes 175 includes a wide end portion 177 and a narrow end portion. The wide end portion 177 overlaps a storage electrode 133 of a storage electrode line 131 and the narrow end portion is partly enclosed by a source electrode 173.

A gate electrode 124, a source electrode 173 and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 may be made of a refractory metal such as, for example, Cr, Mo, Ta, Ti, or alloys thereof. However, the data lines 171 and the drain electrodes 175 may have a multi-layered structure including a refractory metal film (not shown) and a low resistive film (not shown).

The data lines 171 and the drain electrodes 175 have inclined edge profiles, and the inclination angles thereof may range from about 30 degrees to about 80 degrees.

The ohmic contacts 161 and 165 are interposed between the underlying semiconductor stripes 151 and the overlying conductors 171 and 175 thereon, and reduce the contact resistance therebetween. Although the semiconductor stripes 151 are narrower than the data lines 171 at most places, the width of the semiconductor stripes 151 becomes larger near the gate lines 121 and the storage electrode lines 131, to smooth the profile of the surface, thereby preventing disconnection of the data lines 171. The semiconductor stripes 151 include some exposed portions that are not covered with the data lines 171 and the drain electrodes 175, such as portions located between the source electrodes 173 and the drain electrodes 175.

A passivation layer 180, which may be made of an inorganic insulator such as, for example, silicon nitride or silicon oxide, may be formed on the data lines 171, the drain electrodes 175, and the exposed portions of the semiconductor stripes 151. An organic insulating layer 187 may be made of an organic insulator having a low dielectric constant, and may have flatness and photosensitive characteristics. The organic insulating layer 187 may have an embossed surface, and is removed in the pad portion where the end portions 129 and 179 of the gate lines 121 and the data lines 171 are disposed such that the passivation layer 180 only remains in the pad portion.

The passivation layer 180 has a plurality of contact holes 182 exposing the end portions 179 of the data lines 171, respectively. The passivation layer 180 and the gate insulating layer 140 have a plurality of contact holes 181 exposing the end portions 129 of the gate lines 121.

The passivation layer 180 and the organic insulating layer 187 have a plurality of contact holes 185 exposing the wide end portion 177 of the drain electrodes 175. The contact holes 181, 182, and 185 may have various shapes such as, for example, circular and polygonal, and the lateral walls of the contact holes 181, 182, and 185 may have inclination angles ranging from about 30 degrees to about 85 degrees with the surfaces of the substrate 110. The walls of the contact holes 181, 182, and 185 may also have a stepped configuration.

A plurality of pixel electrodes 191 are formed on the organic insulating layer 187. Each of the pixel electrodes 191 is curved along the surface of the organic insulating layer 187, and includes a transmissive electrode 192 and a reflective electrode 194 thereon. The transmissive electrode 192 may be made of, for example, a transparent conductor such as ITO or IZO, and the reflective electrode 194 may be made of reflective metals such as, for example, Ag, Al, Cr, or alloys thereof. The shape of the surface of the reflective electrodes 194 is derived from the shape of the organic insulating layer 187. The organic insulating layer 187 may be embossed such that the reflective efficiency of the reflective electrodes 194 may he maximized. The pixel electrodes 191 may further include a contact assistant layer (not shown), which may be made of Mo, Cr, Ta, Ti, or alloys thereof. The contact assistant layer may improve the contact characteristic between the transmissive electrodes 192 and the reflective electrodes 194, and may prevent the transmissive electrodes 192 from oxidizing the reflective electrodes 194.

A plurality of pixels of the LCD may respectively include a plurality of transmissive regions TA and a plurality of reflective regions RA defined by the transmissive electrodes 192 and the reflective electrodes 194, respectively. Areas disposed under and over an exposed portion of a transmissive electrode 192 are transmissive regions TA, and areas disposed under and over a reflective electrode 194 are reflective regions RA. The reflective electrode 194 is disposed on a portion of the transmissive electrode 192, and thereby the remaining portion of the transmissive electrode 192 is exposed (see FIG. 2). The organic insulating layer 187 is removed in the transmissive regions TA, and the cell gap of the transmissive regions TA may be about twice the cell gap of the reflective regions RA. Accordingly, the differences of light paths passing the liquid crystal layer 3 between the reflective regions RA and the transmissive regions TA may be compensated.

Since the organic insulating layer 187 is removed in the regions where the pixel electrodes 191 are not occupied between the adjacent pixel electrodes 191, the organic insulating layer 187 has a plurality of openings 186 disposed between the adjacent pixel electrodes 191. Here, the side walls of the organic insulating layer 187 defining the openings 186 are tapered, and the openings 186 overlap the data lines 171 and the light blocking layer 122.

Though the arrangements of the liquid crystal molecules are distorted in the regions between the adjacent pixel regions, these openings 186 prevent the distorted arrangements of the liquid crystal molecules from spreading into the pixel regions. Accordingly, the width of the light blocking layers 122 may be minimized such that the aperture ratio of the LCD may be maximized.

The pixel electrodes 191 are physically and electrically connected to the drain electrodes 175 through the contact holes 185 such that the pixel electrodes 191 receive data voltages from the drain electrodes 175. The pixel electrodes 191 that are supplied with the data voltages generate electric fields in cooperation with a common electrode 270 of the common electrode panel 200 that is supplied with a common voltage. The data voltages determine the orientations of LC molecules (not shown) of an LC layer 3 disposed between the two electrodes 191 and 270 to adjust polarization of the incident light passing through the LC layer 3.

A pixel electrode 191 and the common electrode 270 of the common electrode panel 200 form a liquid crystal capacitor, which stores applied voltages after the TFT is turned off. An additional capacitor called a "storage capacitor," which is connected in parallel to the liquid crystal capacitor, is provided for enhancing the voltage storing capacity. The storage capacitors are implemented by overlapping the pixel electrodes 191 with the storage electrode lines 131. The storage capacitor may be formed by overlapping the pixel electrodes 191 with the neighboring gate lines 121, and the storage electrode lines 131 may be omitted.

The pixel electrodes 191 may be overlapped with the gate lines 121 and the data lines 171 to increase the aperture ratio of the LCD.

According to an exemplary embodiment of the present invention, the pixel electrodes 191 are made of a transparent conductive polymer. For a reflective LCD, the pixel electrodes 191 may be made of an opaque reflective metal.

A plurality of contact, assistants 81 and 82 are formed on the passivation layer 180 of the pad regions. The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices. The contact assistants 81 and 82 may be formed with the same layer as the transmissive electrodes 192 or the reflective electrodes 194.

A light blocking member 220 is formed on an insulating substrate 210 and may be made of a material such as, for example, transparent glass or plastic. The light blocking member 220 is referred to as a black matrix, and prevents light leakage between the pixel electrodes 191. The light blocking member 220 has a portion facing the thin film transistors and the gate lines 121. Alternately, the light blocking member 220 may have a plurality of openings that face the pixel electrodes 191 by including a portion facing the data lines 171. However, because the data lines 171 and the light blocking layers 122 block the light leakage in the vertical portion between the pixel electrodes 191, the vertical portion of the light blocking member 220 facing the data lines 171 may be omitted.

A plurality of color filters 230 may also be formed on the substrate 210, and they are disposed substantially in the areas enclosed by the light blocking member 220 and the data lines 171. The color filters 230 may extend substantially in the longitudinal direction along the pixel electrodes 191 between the adjacent data lines 171, thereby forming a belt. The color filters 230 may represent one of three colors such as red, green, and blue, and may include primary colors. The color filters 230 of the reflective regions RA include a plurality of light holes 240.

The light holes 240 compensate for a difference in color tone between the reflective regions RA and the transmissive regions TA due to the difference in the number of times the light rays are transmitted through the color filters 230. Instead of forming the light holes 240, the difference of color tone may be compensated by differing the thicknesses of the color filters 230 in the transmissive regions TA and the reflective regions RA. The light holes 240 may be circular or square. The size of the light holes 240 may be largest in the green color filters 230 and the size of the light holes 240 may be smallest in the blue color filters 230.

An overcoat 250 made of an organic insulating material may be formed on the color filters 230 and the light blocking member 220 for preventing the color filters 230 from being exposed. The overcoat 250 fills the light holes 240 and provides a flat surface.

A common electrode 270 may be formed on the overcoat 250. The common electrode 270 may be made of a transparent conductive material such as, for example, ITO or IZO.

Since the organic insulating layer 187 has a plurality of openings 186 disposed between the adjacent pixel electrodes 191, these openings 186 prevent the distorted arrangements of the liquid crystal molecules between the pixel regions from spreading into the pixel regions. Accordingly, the light leakage generated between the pixel electrodes 191 is minimized such that the width of the light blocking layers 122 may be minimized. In addition, because the data lines 171 and the light blocking layer 122 block the light leakage generated in the vertical region among the regions between the pixel electrodes 191, the vertical portion of the light blocking member 220 may be omitted. Accordingly, the aperture ratio of the LCD may be maximized such that the quality of the LCD may be improved.

Figure 5:
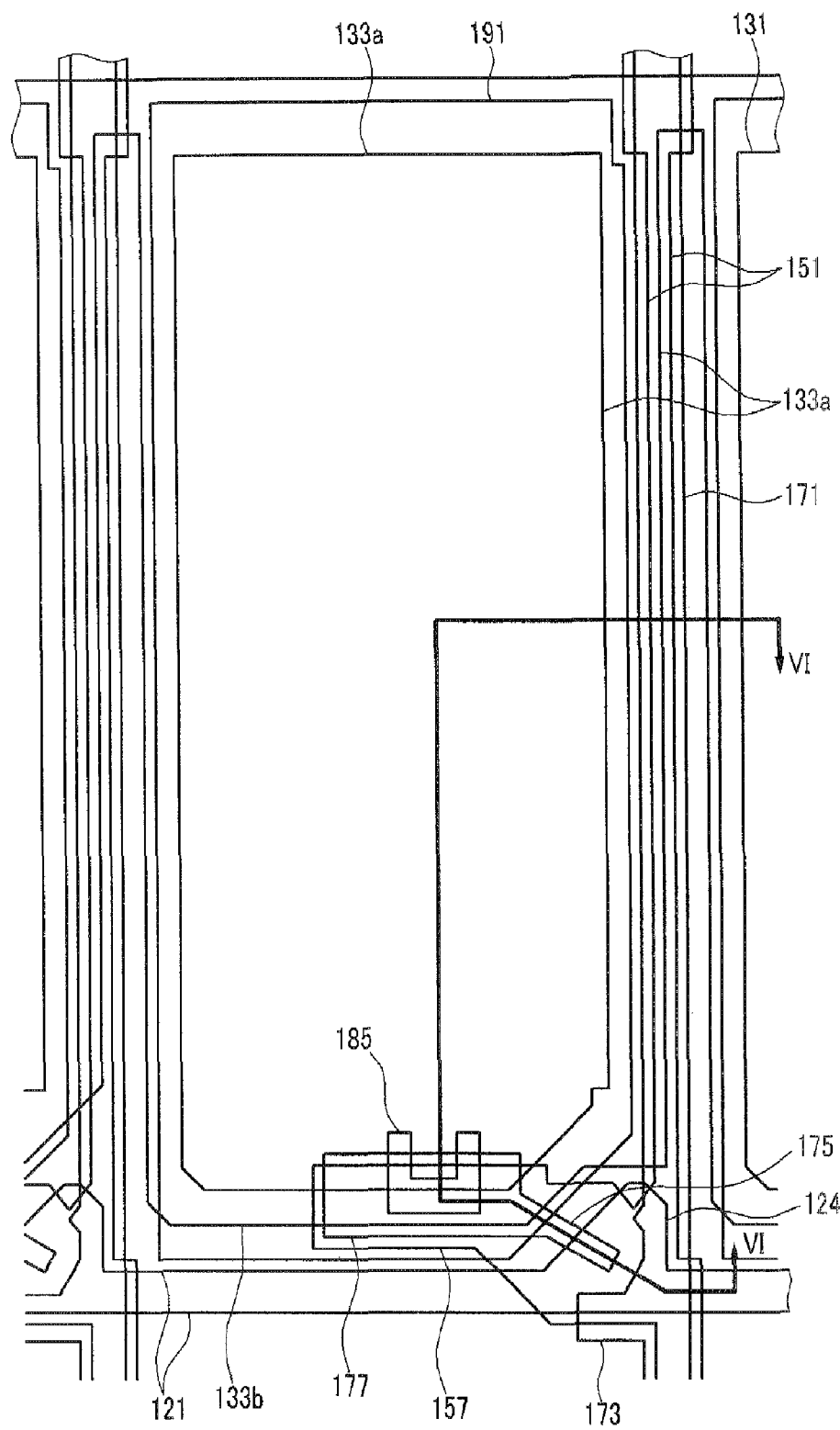
FIG. 5 is a layout view of a thin film transistor array panel for an LCD according to an exemplary embodiment of the present invention.
Figure 6:
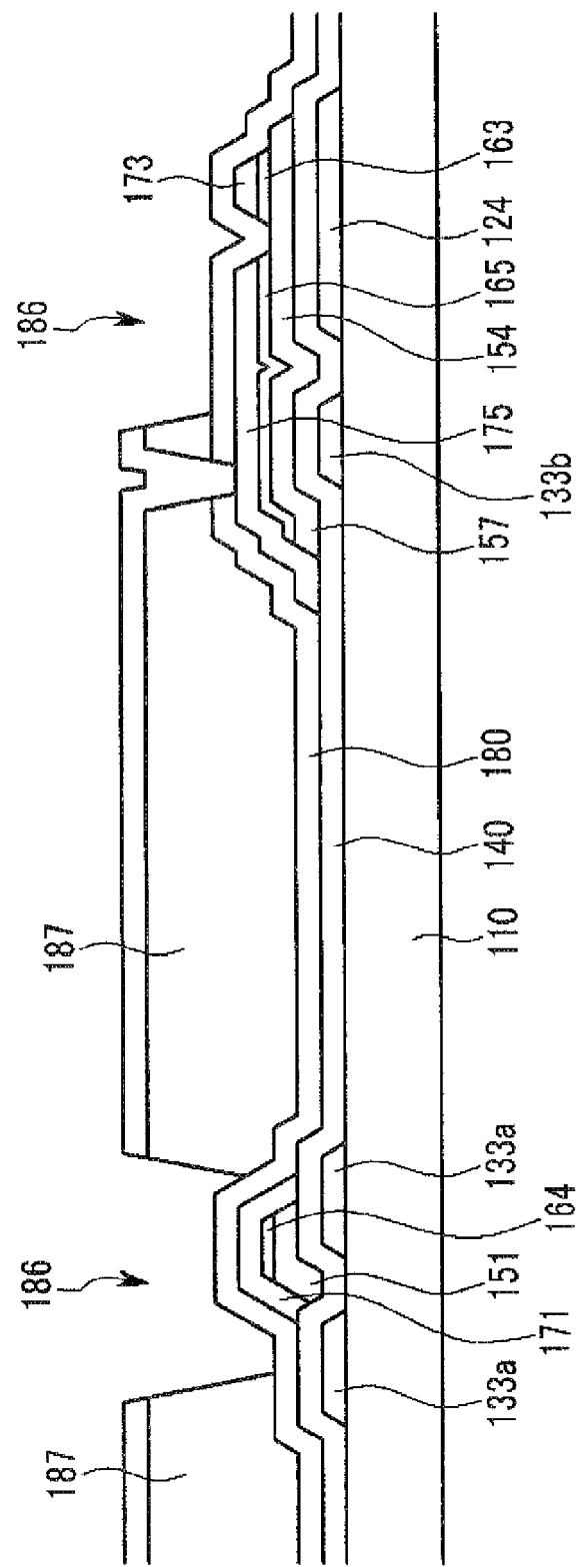
FIG. 6 is a sectional view of the thin film transistor array panel shown in FIG. 5 taken along line VI-VI.

FIG. 5 is a layout view of a thin film transistor array panel for an LCD according to an exemplary embodiment of the present invention, and FIG. 6 is a sectional view of the thin film transistor array panel shown in FIG. 5 taken along line VI-VI.

Layered structures of the panels according to this embodiment are similar to those shown in FIGS. 1 to 4.

In the TFT array panel, a plurality of gate lines 121 including gate electrodes 124 and a plurality of storage electrode lines 131 including a plurality of storage electrodes are formed on a substrate 110, and a gate insulating layer 140, a plurality of semiconductor stripes 151 including projections 154, and a plurality of ohmic contact stripes 161 including projections 163 and a plurality of ohmic contact islands 165 are sequentially formed thereon. A plurality of data lines 171 including source electrodes 173, and a plurality of drain electrodes 175 are formed on the ohmic contacts 161 and 165, and the gate insulating layer 140, and a passivation layer 180 and an organic insulating layer 187 having a plurality of openings 186 are formed thereon. A plurality of contact holes 185 are provided at the passivation layer 180 and the organic insulating layer 187. A plurality of pixel electrodes 191 are formed on the passivation layer 180.

Different from the LCD shown in FIGS. 1 to 4, the storage electrode lines 131 include a plurality of first storage electrodes 133a extending substantially parallel to each other in the vertical direction and a plurality of second storage electrodes 133b extending substantially parallel to the gate lines 121 and connecting the first storage electrodes 133a.

The contact holes 185 exposing the protrusions 177 of the drain electrodes 175 are extended outside the edges of the drain electrodes 175 and may become "U" shapes.

The pixel electrodes 191 defining the openings 186 of the organic insulating layer 187 may be made of a single transparent conductive layer. The pixel electrodes 191 are used in the transmissive LCD for displaying the image by using the light passing through the liquid crystal display from the backlight.

A light blocking member of a common electrode panel in the LCD may have a plurality of openings facing the pixel electrodes 191.

Since the organic insulating layer 187 has a plurality of openings 186 disposed between the adjacent pixel electrodes 191, these openings 186 prevent the distorted arrangements of the liquid crystal molecules between the pixel regions from spreading into the pixel regions such that the aperture ratio of the LCD may be maximized.

A method of manufacturing the TFT array panel shown in FIGS. 5 and 6 according to an exemplary embodiment of the present invention will be described in detail with reference to FIGS. 5, 6, and 7-15.

Figure 7:
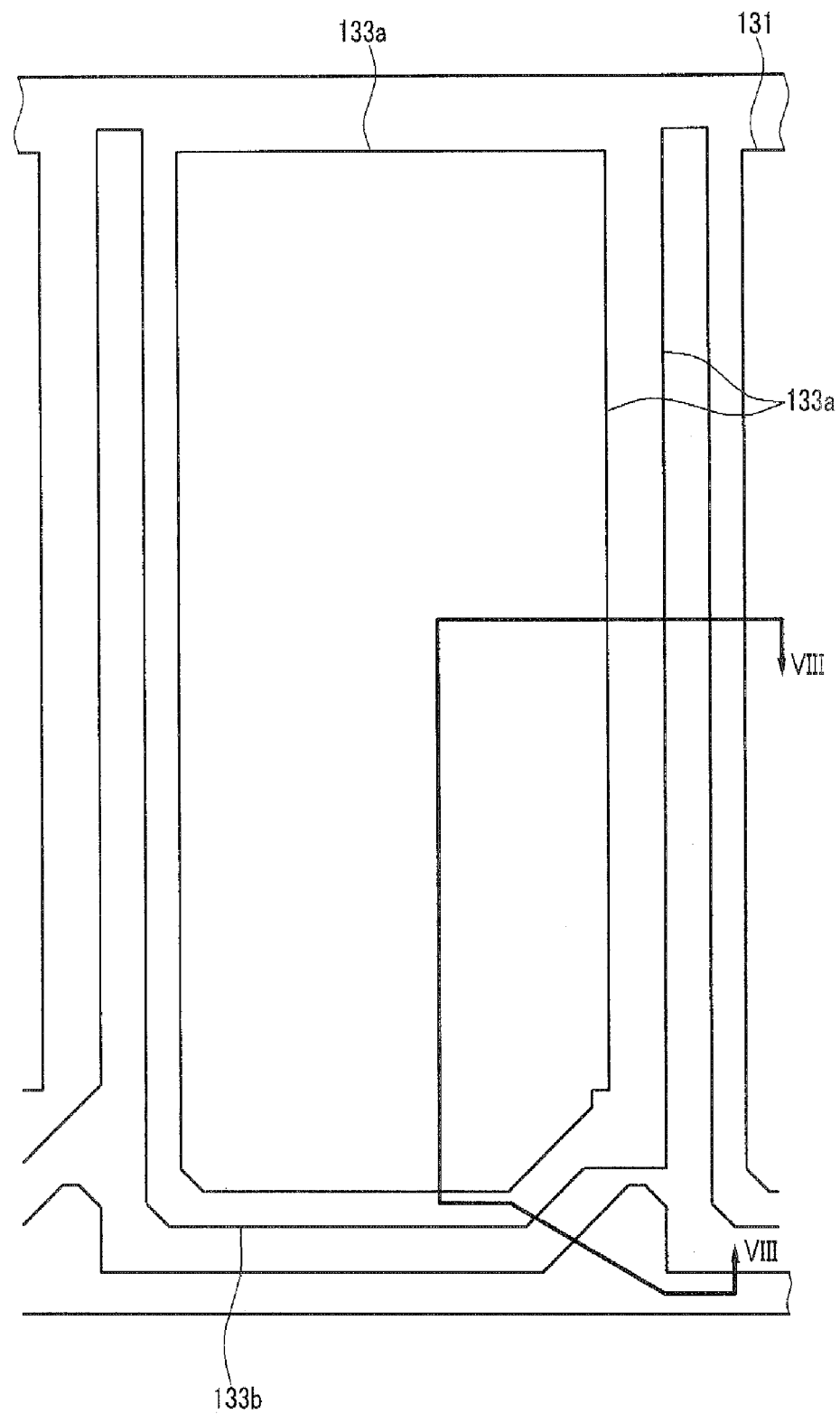
FIGS. 7, 9, 11, and 13 are layout views of the TFT array panel shown in FIGS. 5 and 6 during steps of a manufacturing method thereof according to an exemplary embodiment of the present invention.
Figure 8:
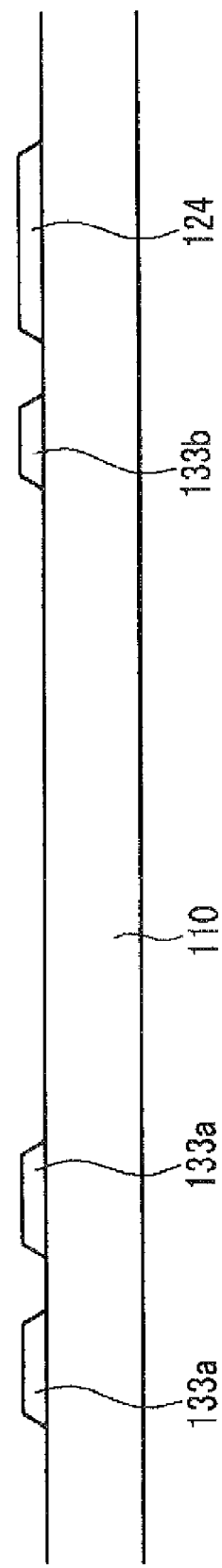
FIG. 8 is a sectional view of the TFT array panel shown in FIG. 7 taken along line VIII-VIII.
Figure 9:
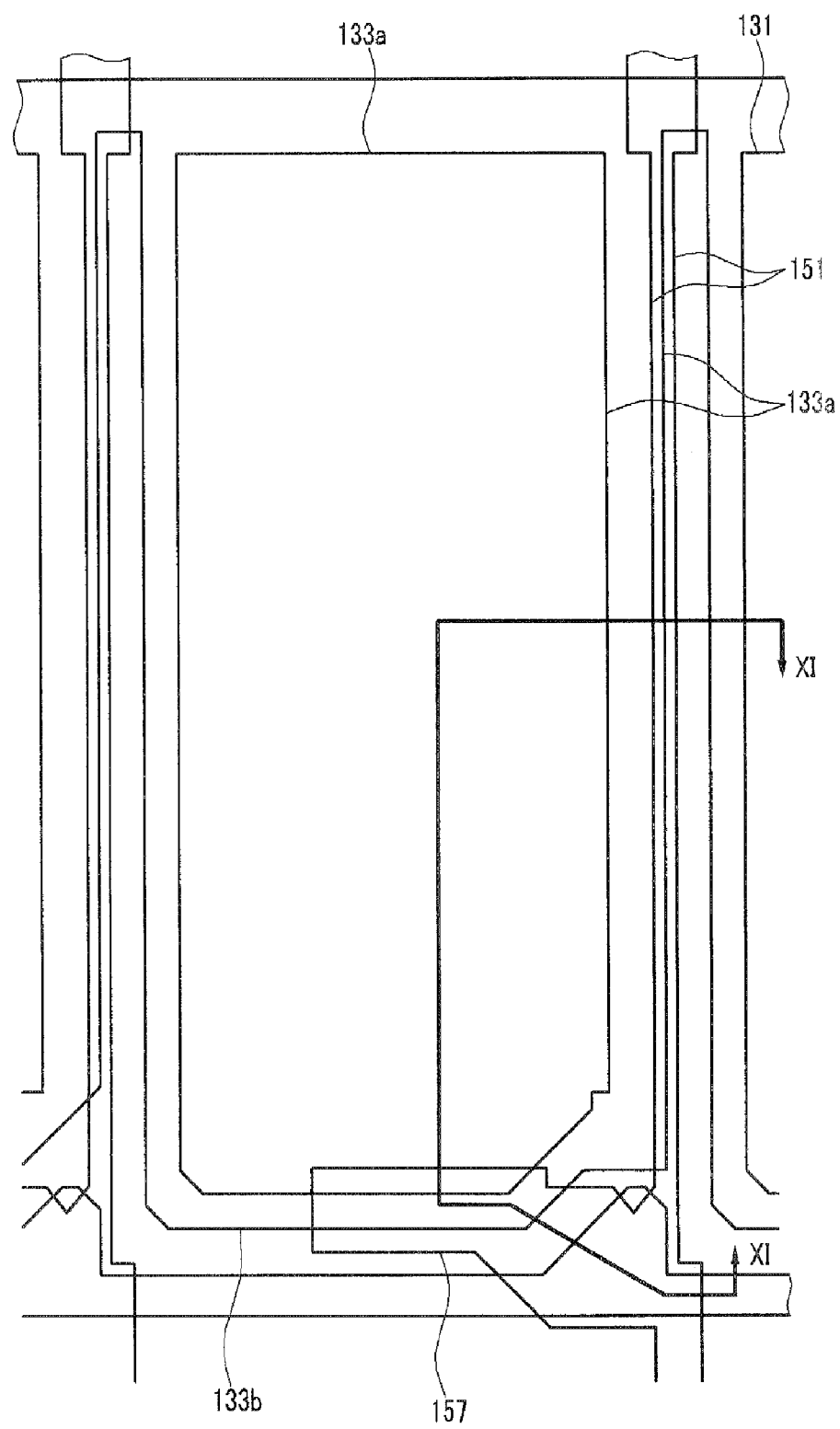
Figure 10:
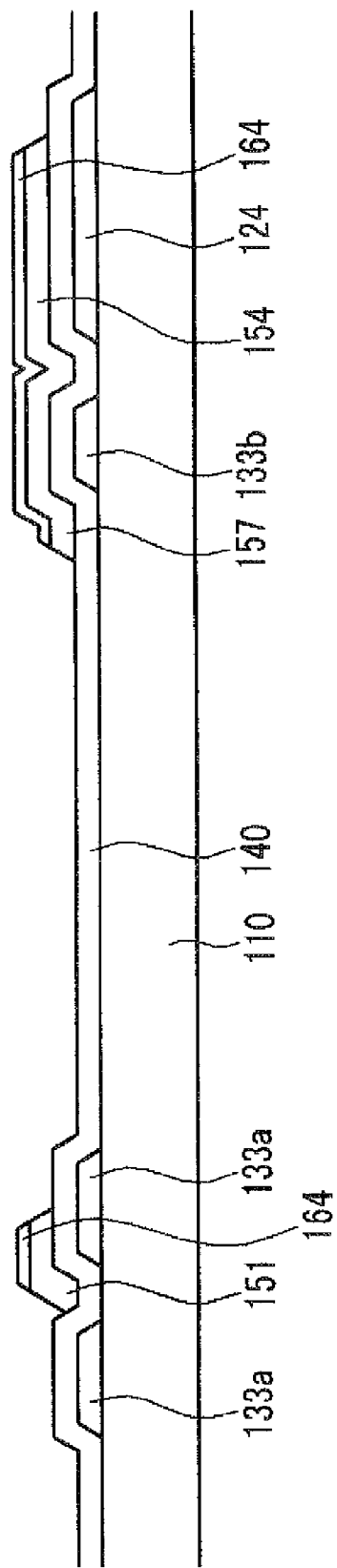
FIG. 10 is a sectional view of the TFT array panel shown in FIG. 9 taken along line X-X.
Figure 11:
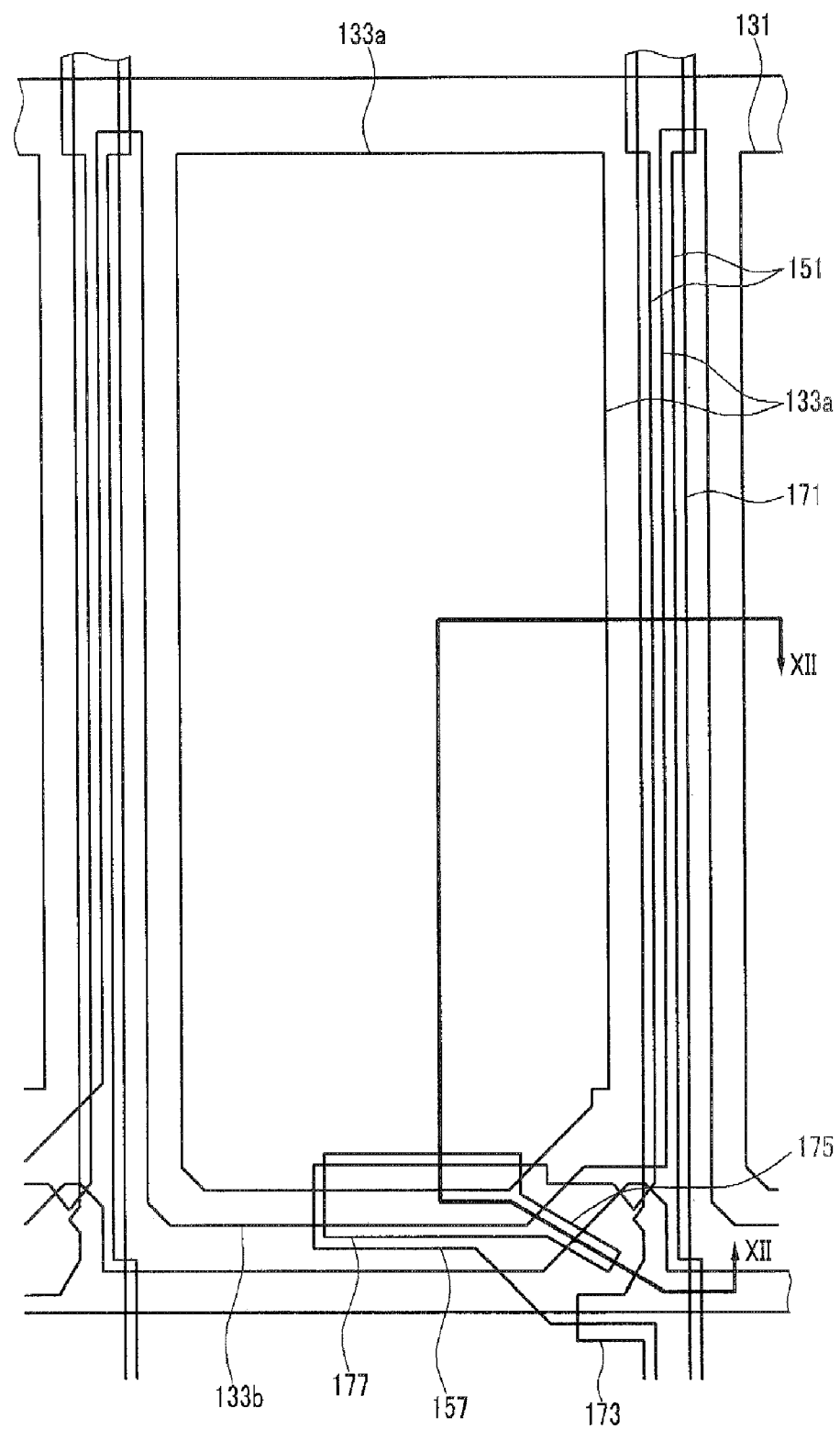
Figure 12:
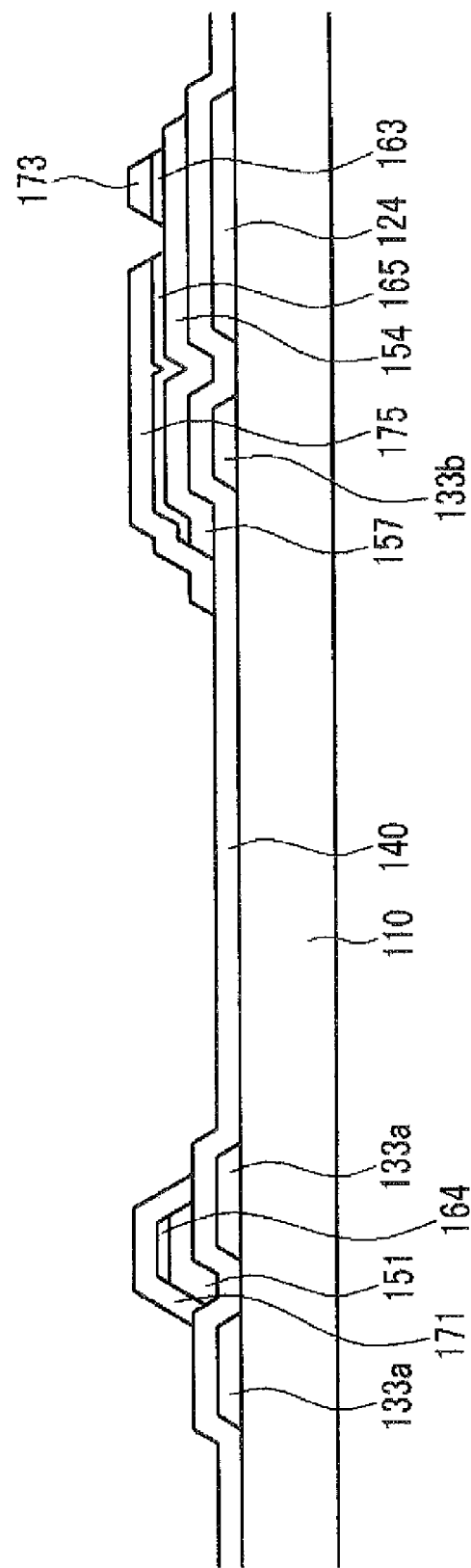
FIG. 12 is a sectional view of the TFT array panel shown in FIG. 11 taken along line XII-XII.
Figure 13:
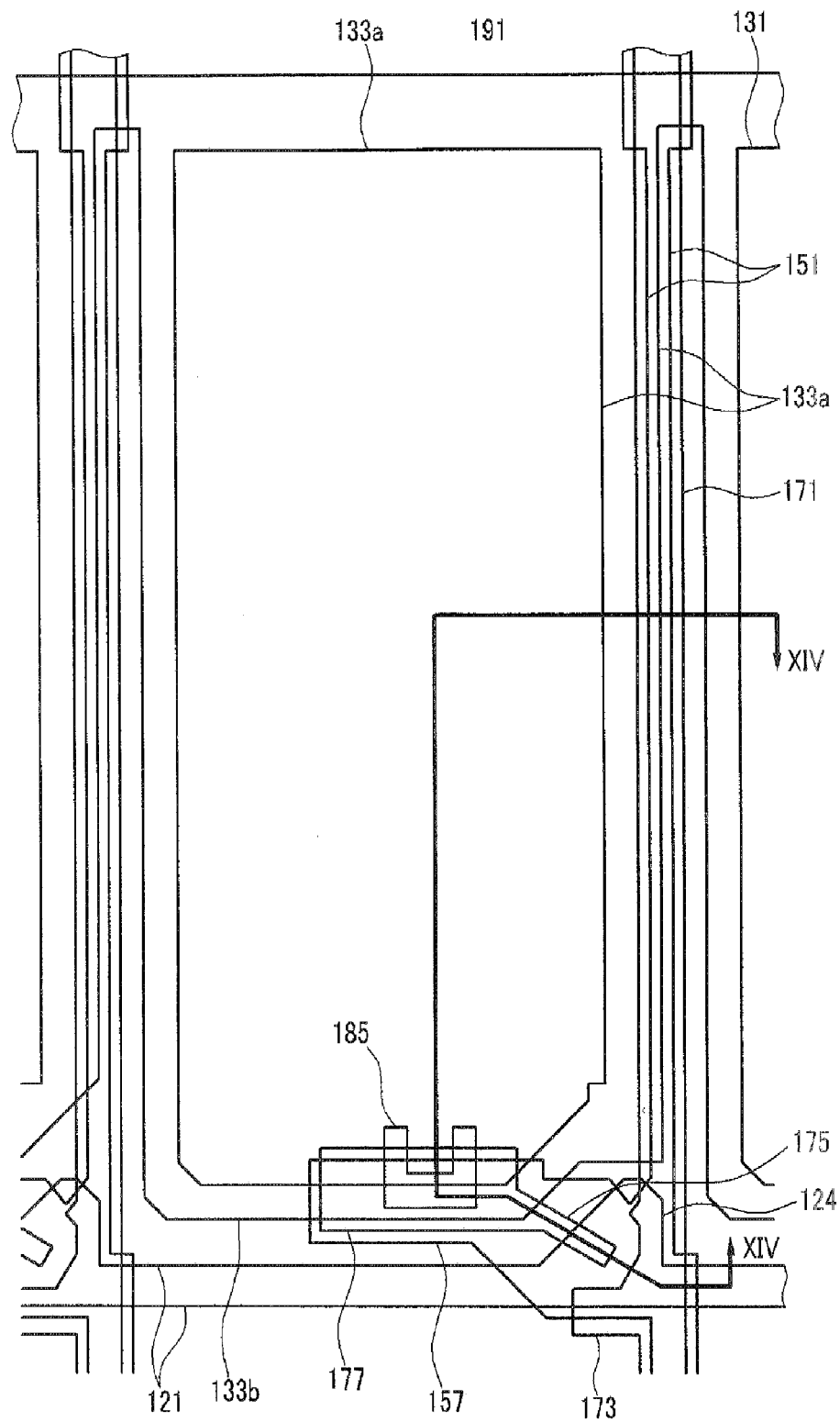
Figure 14:
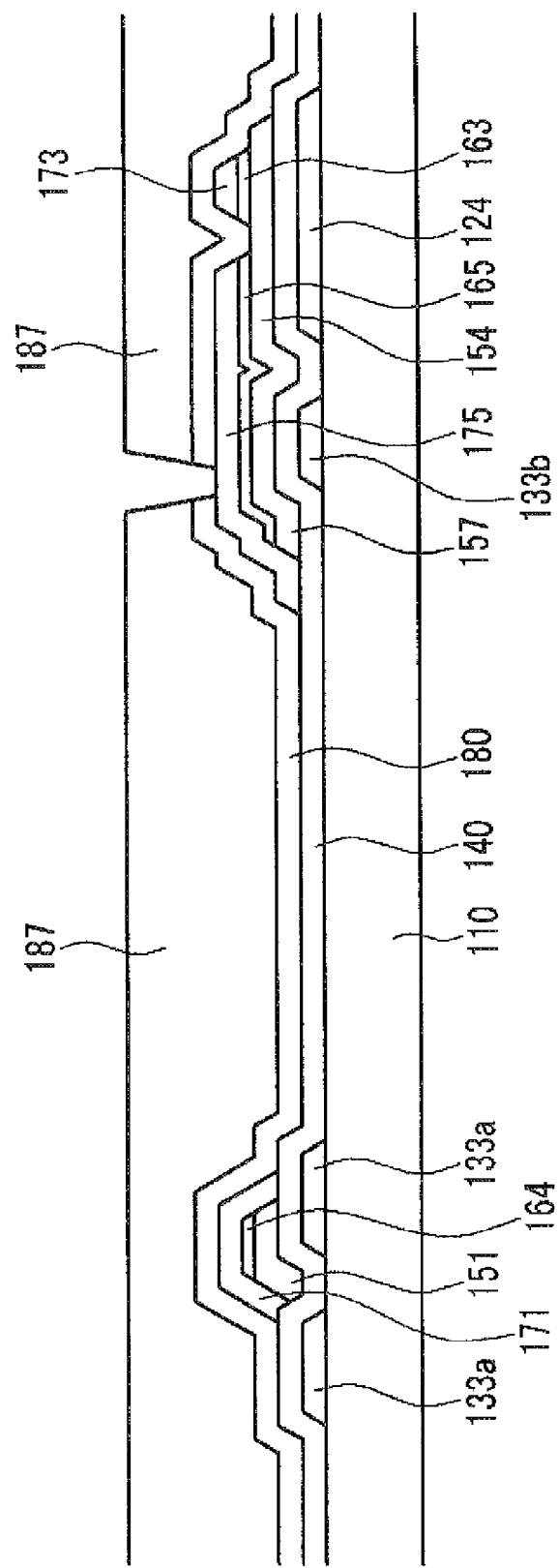
FIG. 14 is a sectional view of the TFT array panel shown in FIG. 13 taken along line XIV-XIV.
Figure 15:
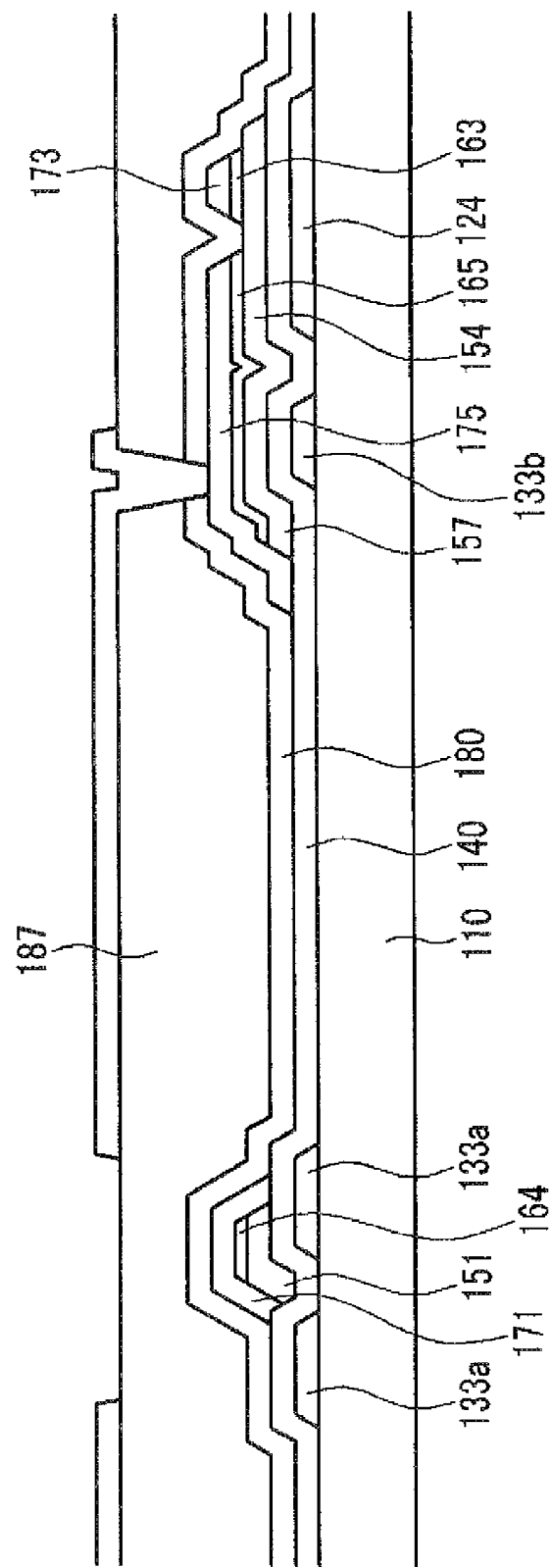
FIG. 15 is a sectional view of the TFT array panel shown in FIG. 13 taken along line XIV-XIV after the addition of pixel electrodes on an insulating layer.

FIGS. 7, 9, 11, and 13 are layout views of the organic TFT array panel shown in FIGS. 5 and 6 during steps of a manufacturing method thereof according to an exemplary embodiment of the present invention, FIG. 8 is a sectional view of the TFT array panel shown in FIG. 7 taken along line VIII-VIII, FIG. 10 is a sectional view of the TFT array panel shown in FIG. 9 taken along line X-X, FIG. 12 is a sectional view of the TFT array panel shown in FIG. 11 taken along line XII-XII, FIG. 14 is a sectional view of the TFT array panel shown in FIG. 13 taken along line XIV-XIV, and FIG. 15 is a sectional view of the TFT array panel shown in FIG. 13 taken along line XIV-XIV after the addition of pixel electrodes on an insulating layer.

As shown in FIGS. 7 and 8, a conductive layer is sputtered on an insulating substrate 110 made of a material such as, for example, transparent glass or plastic, and may be patterned by wet etching with a photoresist pattern to form a plurality of gate lines 121 including a plurality of gate electrodes 124 and an end portion 129, and a plurality of storage electrodes 131 having first and second storage electrodes 133a and 133b.

After sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 may be deposited with a thickness of about 2000 Å to about 5000 Å in a temperature range of about 250° C. to 500° C., as shown in FIGS. 9 and 10.

As shown in FIGS. 10 to 12, a metal layer is sputtered on the gate insulating layer 140, and may be patterned by wet etching with a photoresist pattern to form a plurality of data lines 171 including a plurality of source electrodes 173 and an end portion 179, and a plurality of drain electrodes 175.

Portions of the extrinsic a-Si layer 164 that are not covered with the data lines 171 and the drain electrodes 175 may be removed by etching to complete a plurality of ohmic contact stripes 161 including a plurality of projections 163 and a plurality of ohmic contact islands 165, and to expose portions of the intrinsic semiconductor stripes 151. The exposed surfaces of the semiconductor stripes 151 may be stabilized thereafter by use of an oxygen plasma treatment.

As shown in FIGS. 13 and 14, a passivation layer 180, which may be made of an inorganic insulating material such as, for example, silicon nitride, and an organic insulating layer 187 with photosensitivity or flatness characteristics may be sequentially deposited on the data lines 171, the drain electrodes 175, and the exposed semiconductor stripes 151.

Thereafter, the passivation layer 180 and the organic insulating layer 187 are photo-etched to form a plurality of contact holes 185 exposing the drain electrodes 175.

As shown in FIGS. 5 and 15, a transparent material such as, for example, ITO is sputtered and etched to form a plurality of pixel electrodes 191 on the organic insulating layer 187.

Next, as shown in FIG. 6, the portion of the organic insulating layer 187 that is not covered by the pixel electrodes 191 is removed to form a plurality of openings 186.

During this manufacturing process, the pixel electrodes 191 or the photoresist pattern for forming the pixel electrodes 191 is used as an etch mask to form the openings 186 such that a mask to form the openings 186 is not added.

Figure 16:
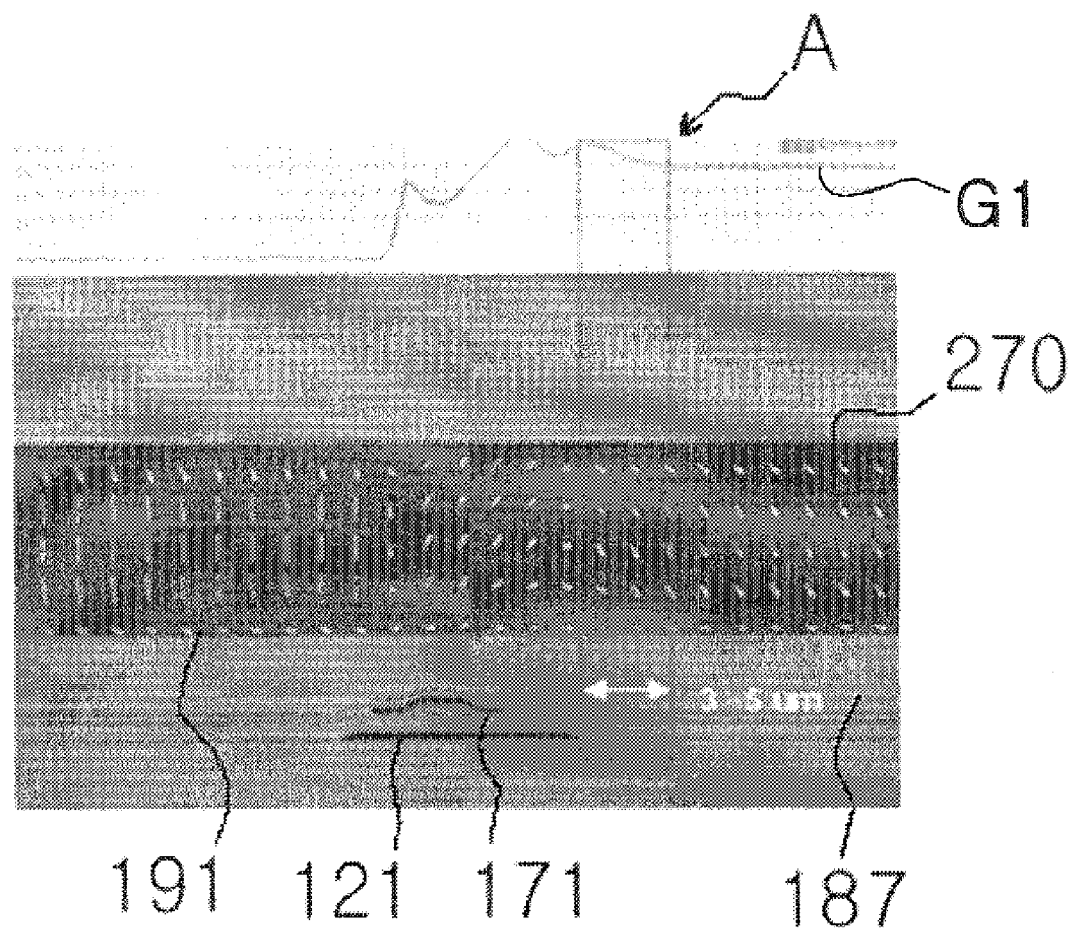
FIG. 16 is a graph showing light leakage generated in a conventional LCD.
Figure 17:
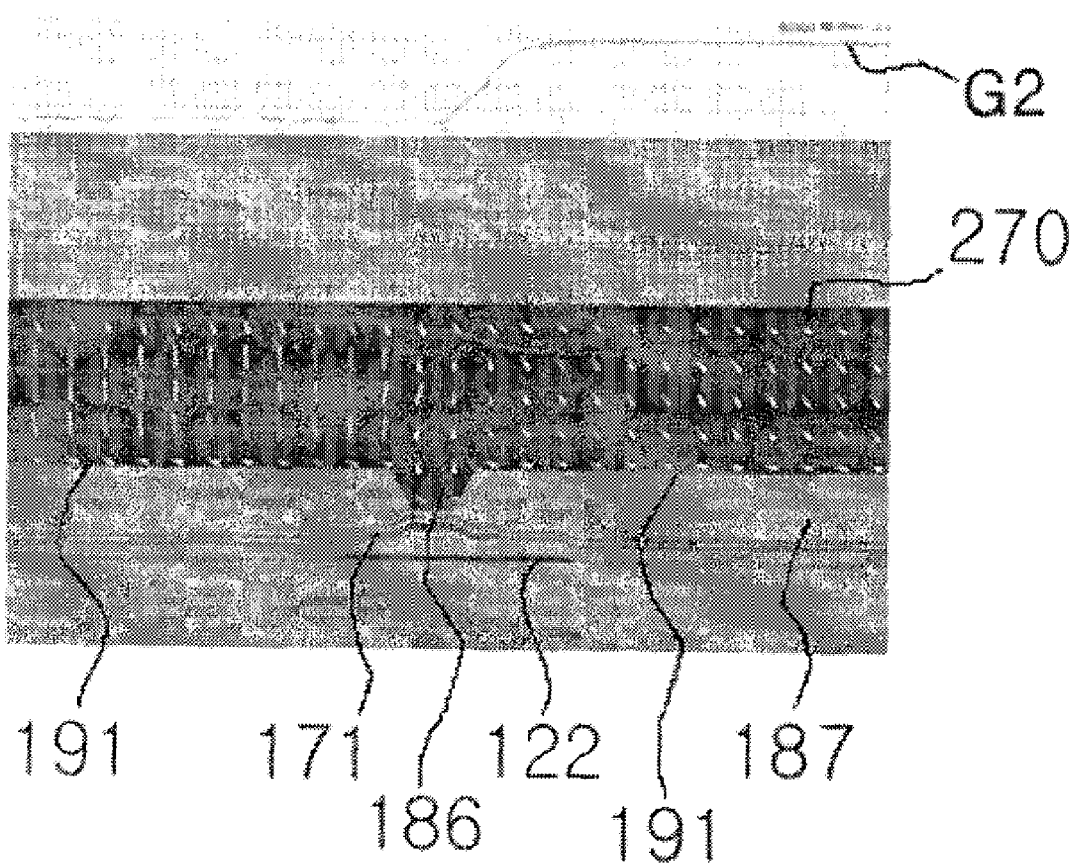
FIG. 17 is a graph showing light leakage generated in an LCD according to an exemplary embodiment of the present invention.

FIG. 16 is a cross section showing light leakage generated in a conventional LCD, and FIG. 17 is a cross-section showing light leakage generated in an LCD according to an exemplary embodiment of the present invention. Here, graphs G1 and G2 which are added on the cross-section views show the transmittance of the regions corresponding to the portions.

In these figures, the LCD is an ECB mode display, and the liquid crystal material has positive dielectric anisotropy. The upper and lower alignment layers are aligned in horizontal and anti-parallel directions to each other, and differing voltages are applied to two pixel electrodes 191 that are disposed on each side with respect to the data lines 171 and the light blocking layer 122.

As shown in FIG. 16, when applying different voltages to two adjacent pixel electrodes 191, the liquid crystal molecules that are disposed between two adjacent pixel electrodes 191 are distorted such that the liquid crystal molecules that are disposed on the edges of the pixel regions corresponding to the pixel electrodes 191 are also distorted. Accordingly, as shown in the graph G1, the light leakage is suddenly increased in the A region which is the portion of the pixel region where the transmittance of the A region is rapidly increased. Therefore, the light blocking layer 122 must widen to prevent the light leakage, causing the aperture ratio to decrease due to the wider light blocking layer 122.

As shown in FIG. 17, when disposing the opening 186 between the adjacent pixel electrodes 191, the distorted arrangements of the liquid crystal molecules disposed between two adjacent pixel electrodes 191 are blocked by the opening 186 such that the distorted arrangements of the liquid crystal molecules are not spread in the pixel region. Accordingly, as shown in the graph G2, the light leakage is small in the edge of the pixel region such that the transmittance of the edge region is not rapidly increased and the slope of the graph G2 more gradually. Therefore, the light leakage generated between the pixel electrodes 191 may be prevented by disposing the openings 186 as a trench of the organic insulating layer 187 between the pixel electrodes 191 such that the aperture ratio may be maximized and the quality of the LCD may be improved.

The organic insulation may be completely removed to form the openings 186, but a portion of the organic insulating layer 187 may be removed to form a trench and the trench may provide the same effects as the openings.

Although, an ECB mode has been described with respect to exemplary embodiments of the present invention, the present invention is not limited thereto, and may be adapted to various modes such as a twisted nematic (TN) LCD and a vertically aligned (VA) LCD.

As described above, the light leakage generated on the edge of the pixel regions may be prevented by disposing the openings or the trench between the pixel electrodes in the insulating layer under the pixel electrodes, and accordingly the aperture ratio may be maximized and the quality of the LCD may be improved.

Having described exemplary embodiments of the present invention, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   an insulating substrate;
   a plurality of gate lines formed on the substrate, wherein each of the gate lines include a plurality of gate electrodes;
   a plurality of data lines disposed on the insulating substrate, wherein each of the data lines include a plurality of source electrodes;
   a plurality of drain electrodes facing the source electrodes;
   an insulating layer formed on the gate lines, the data lines, and the drain electrodes, wherein at least a portion of the insulating layer is removed to have an opening or a trench and the opening or trench is disposed between adjacent pixel electrodes;

a plurality of pixel electrodes formed on the insulating layer and connected to the drain electrodes; and a light blocking layer disposed between adjacent pixel electrodes and overlapping the opening or the trench.

2. The thin film transistor array panel of claim 1, wherein the insulating layer is made of an organic insulating material.

3. The thin film transistor array panel of claim 1, wherein the light blocking layer is made of a same layer as the gate lines without overlapping the gate lines.

4. The thin film transistor array panel of claim 3, wherein the light blocking layer overlaps the data lines.

5. The thin film transistor array panel of claim 1, further comprising a passivation layer formed under the insulating layer and covering the gate lines, the data lines, and the drain electrodes.

6. The thin film transistor array panel of claim 5, wherein the passivation layer and the insulating layer have a plurality of contact holes to connect the pixel electrodes to the drain electrodes.

7. The thin film transistor array panel of claim 1, wherein the pixel electrodes include a transparent electrode made of a transparent conductive material and a reflective electrode made of a reflective material.

8. The thin film transistor array panel of claim 7, wherein the insulating layer has an embossed surface.

9. The thin film transistor array panel of claim 8, wherein a pixel region occupied by a pixel electrode includes a first region only occupied by the transparent electrode and a second region occupied by the transparent electrode and the reflective electrode.

10. The thin film transistor array panel of claim 1, wherein the respective adjacent pixel electrodes extend to opposing side walls of the opening or the trench.

11. A thin film transistor array panel, comprising:

an insulating substrate;

a plurality of gate lines formed on the substrate, wherein each of the gate lines include a plurality of gate electrodes;

a plurality of data lines disposed on the insulating substrate, wherein each of the data lines include a plurality of source electrodes;

a plurality of drain electrodes facing the source electrodes;

an insulating layer formed on the gate lines, the data lines, and the drain electrodes;

a plurality of pixel electrodes formed on the insulating layer and connected to the drain electrodes; and a light blocking layer disposed between adjacent pixel electrodes, wherein the insulating layer has a trench and the trench is overlapped and disposed within a boundary of the light blocking layer.

12. The thin film transistor array panel of claim 11, wherein the insulating layer is made of an organic insulating material.

13. The thin film transistor array panel of claim 11, wherein the light blocking layer overlaps the data lines.

14. The thin film transistor array panel of claim 11, further comprising a passivation layer formed under the insulating layer and covering the gate lines, the data lines, and the drain electrodes.

15. The thin film transistor array panel of claim 14, wherein the passivation layer and the insulating layer have a plurality of contact holes to connect the pixel electrodes to the drain electrodes.

16. The thin film transistor array panel of claim 11, wherein the pixel electrodes include a transparent electrode made of a transparent conductive material and a reflective electrode made of a reflective material.

17. The thin film transistor array panel of claim 16, wherein the insulating layer has an embossed surface.

18. The thin film transistor array panel of claim 17, wherein a pixel region occupied by a pixel electrode includes a first region only occupied by the transparent electrode and a second region occupied by the transparent electrode and the reflective electrode.

* * * * *